United States Patent
Adiga et al.

(10) Patent No.: US 9,449,787 B2
(45) Date of Patent: Sep. 20, 2016

(54) LIQUID FLOW CELLS HAVING GRAPHENE ON NITRIDE FOR MICROSCOPY

(71) Applicants: Vivekananda P. Adiga, Albany, CA (US); Gabriel Dunn, Berkeley, CA (US); Alexander K. Zettl, Kensington, CA (US); A. Paul Alivisatos, Berkeley, CA (US)

(72) Inventors: Vivekananda P. Adiga, Albany, CA (US); Gabriel Dunn, Berkeley, CA (US); Alexander K. Zettl, Kensington, CA (US); A. Paul Alivisatos, Berkeley, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 14/817,551

(22) Filed: Aug. 4, 2015

(65) Prior Publication Data

US 2016/0042912 A1    Feb. 11, 2016

Related U.S. Application Data

(60) Provisional application No. 62/034,597, filed on Aug. 7, 2014.

(51) Int. Cl.

| | |
|---|---|
| *G02B 1/12* | (2006.01) |
| *H01J 37/16* | (2006.01) |
| *H01J 37/26* | (2006.01) |
| *H01J 37/20* | (2006.01) |
| *H01L 29/68* | (2006.01) |
| *H01L 29/78* | (2006.01) |
| *H01L 29/16* | (2006.01) |
| *C23C 18/08* | (2006.01) |

(Continued)

(52) U.S. Cl.
CPC .............. *H01J 37/20* (2013.01); *G02B 1/12* (2013.01); *C23C 18/08* (2013.01); *G02B 21/16* (2013.01); *H01J 37/26* (2013.01); *H01J 2237/2003* (2013.01); *H01L 29/1606* (2013.01); *H01L 29/66045* (2013.01); *Y10T 29/49002* (2015.01)

(58) Field of Classification Search
CPC .. H01J 2237/2003; H01J 37/20; H01J 37/26; H01L 29/1606; H01L 29/66045; Y10T 29/49002; C23C 18/08
See application file for complete search history.

(56) References Cited

U.S. PATENT DOCUMENTS

2012/0326115 A1\* 12/2012 Choi ................. H01L 21/02381
                                                                257/9
2015/0118126 A1    4/2015 Khalid et al.

OTHER PUBLICATIONS

Joseph M. Grogan and Haim H. Bau, The Nanoaquarium: A Platform for In Situ Transmission Electron Microscopy in L qu d Med a, Journal of M Croelectromechan CAL Systems, vol. 19, No. 4, Aug. 2010, 885-894.*

(Continued)

*Primary Examiner* — Jennifer Wecker
(74) *Attorney, Agent, or Firm* — Lawrence Berkeley National Laboratory

(57) ABSTRACT

This disclosure provides systems, methods, and apparatus related to liquid flow cells for microscopy. In one aspect, a device includes a substrate having a first and a second oxide layer disposed on surfaces of the substrate. A first and a second nitride layer are disposed on the first and second oxide layers, respectively. A cavity is defined in the first oxide layer, the first nitride layer, and the substrate, with the cavity including a third nitride layer disposed on walls of the substrate and the second oxide layer that define the cavity. A channel is defined in the second oxide layer. An inlet port and an outlet port are defined in the second nitride layer and in fluid communication with the channel. A plurality of viewports is defined in the second nitride layer. A first graphene sheet is disposed on the second nitride layer covering the plurality of viewports.

20 Claims, 13 Drawing Sheets

(51) Int. Cl.
  *H01L 29/66* (2006.01)
  *G02B 21/16* (2006.01)

(56) References Cited

OTHER PUBLICATIONS

Joseph M. Grogan and Haim H. Bau, The Nanoaquarium: A Platform for In Situ Transmission Electron Microscopy in Liquid Media, Journal of Microelectromechanical Systems, vol. 19, No. 4, Aug. 2010, 885-894.
Tobias Schuh and Nielsde Jonge, Liquid scanning transmission electron microscopy: Nanoscale imaging in micrometers-thick liquids, C. R. Physique 15 (2014) 214-223.
C. Mueller et al., Nanofluidic Cells with Controlled Pathlength and Liquid Flow for Rapid, High-Resolution In Situ Imaging with Electrons, J. Phys. Chem. Lett. 2013, 4, 2339-2347.

* cited by examiner

LIQUID FLOW CELLS HAVING GRAPHENE ON NITRIDE FOR MICROSCOPY

RELATED APPLICATIONS

This application claims priority to U.S. Provisional Patent Application No. 62/034,597, filed Aug. 7, 2014, which is herein incorporated by reference. This application is related to U.S. patent application Ser. No. 14/524,866, filed Oct. 27, 2014, which is herein incorporated by reference.

STATEMENT OF GOVERNMENT SUPPORT

This invention was made with government support under Contract No. DE-AC02-05CH11231 awarded by the U.S. Department of Energy, under Award No. HDTRA1-13-1-0035 awarded by the Defense Threat Reduction Agency (DTRA), and under Grant No. EEC-0832819 awarded by the National Science Foundation (NSF). The government has certain rights in this invention.

TECHNICAL FIELD

This disclosure relates generally to liquid flow cells for microscopy and more particularly to liquid flow cells for transmission electron microscopy.

BACKGROUND

Transmission electron microscopy (TEM) provides ultrahigh resolution imaging of samples, surpassing the diffraction limit offered by optical microscopy. Due to the ultrahigh vacuum environment associated with TEM, the imaging of liquid samples or samples (e.g., nanoparticles or biological samples) suspended in a liquid (i.e., in situ liquid TEM) is not straightforward. In recent years, the development of in situ flow cells generally comprising a thin spacer sandwiched between two chips with thin (less than about 100 nanometer (nm)) silicon nitride membranes has led the field of in situ liquid TEM. The liquid sample is isolated from the ultrahigh vacuum environment by the spacer and is imaged through the silicon nitride membrane. Metallic contacts can be used to produce electrical biases across the liquid sample.

In situ liquid TEM imaging has found applications in a wide number of fields and has been used to study chemical and electrochemical processes, biological structures, and nanoparticle growth and dynamics, all at the nanoscale. However, due to the thickness and material properties of silicon nitride, some of the in situ flow cells suffer from decreased resolution and contrast, charging effects, and increased damage to the sample from electrons scattered by the silicon nitride. The low thermal conductivity of silicon nitride can also result in heating of the sample.

BRIEF DESCRIPTION OF THE DRAWINGS

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
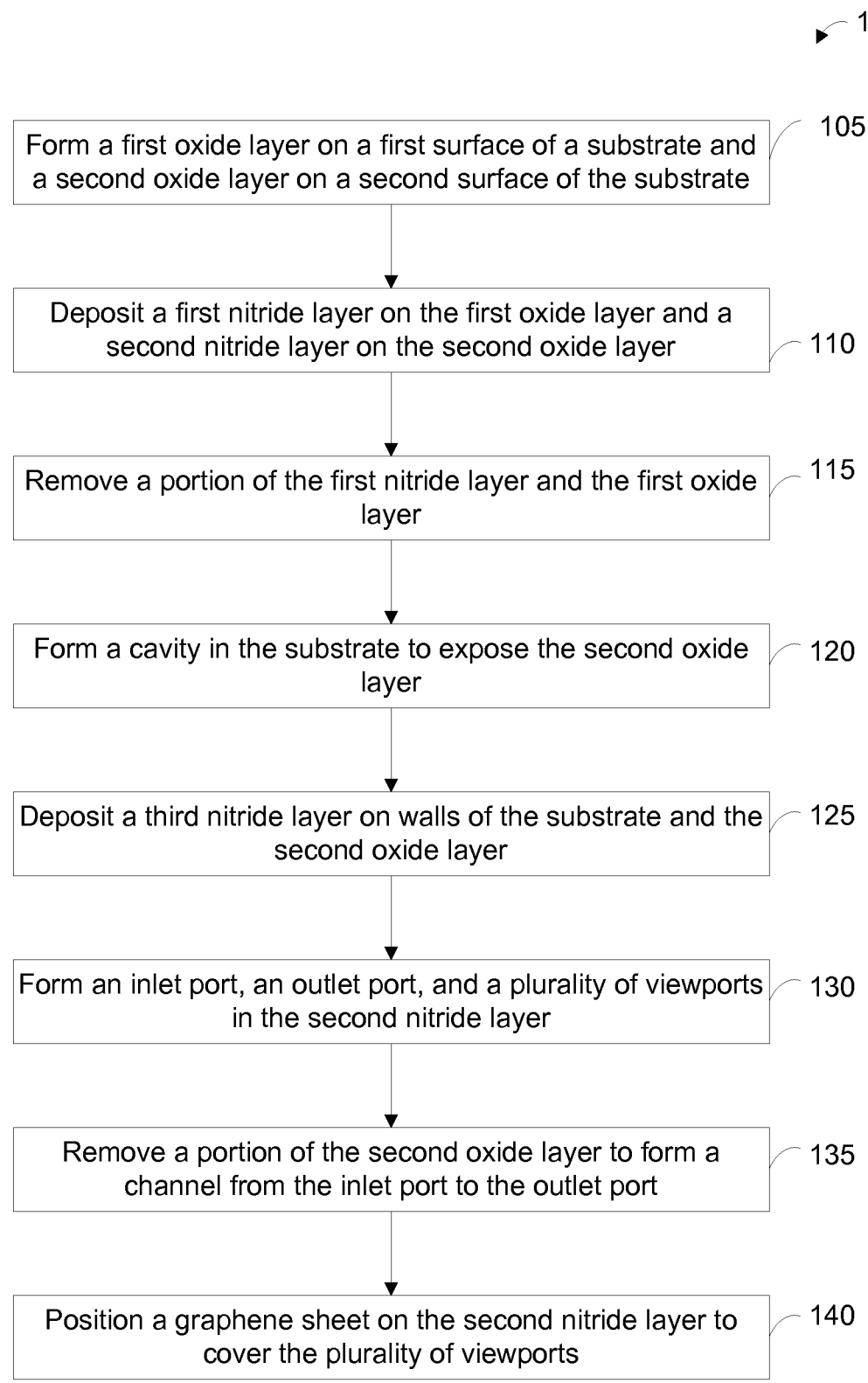
FIG. 1 shows an example of a flow diagram illustrating a manufacturing process for a liquid flow cell.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Introduction

Graphene has been shown to be a good membrane material for in situ liquid TEM due to its electron transparency, electrical properties, and thermal properties. Graphene liquid cells previously developed, consisting of pockets of solution trapped between two sheets of graphene, have enabled atomic resolution imaging of samples in situ, and show a complete absence of the charging effects seen in silicon nitride ($Si_3N_4$).

Besides its high electron transparency, another advantage of using graphene layers is the surface inertness of graphene. This inertness is expected to allow the encapsulation of free floating biological samples without them being nonspecifically absorbed onto a liquid cell surface. Additionally, recent work suggests that graphene membranes may have a stabilizing effect when imaging biological samples, which may reduce damage to specimens due to the electron beam.

Despite these advantages, the current fabrication methods of graphene liquid cells may not allow for liquid flow and may lack contacts for in situ electrochemical studies. Further, current fabrication methods may require a great deal of expertise. The resulting graphene liquid flow cell also may be non-reusable. Difficulty in getting 100% intact graphene sheets over large areas makes simply replacing silicon nitride with graphene in current liquid flow cell designs impractical. Further, the low bending stiffness of graphene compared to tensioned silicon nitride results in increased liquid thickness under vacuum, which may negate the advantage offered by the atomically thin graphene. This leaves silicon nitride liquid flow cells as a currently viable option for in situ liquid TEM studies.

Described herein are embodiments of a graphene on nitride (e.g., silicon nitride) flow cell and methods of fabrication thereof. Such a flow cell combines advantages offered by both graphene and silicon nitride. The channel in such a flow cell may be capable of sustained liquid flow and can be electrical contacted. By fully integrating nanofluidic channels (e.g., with widths of about 500 nanometers (nm) to 2 microns) fabricated within a single substrate, the bowing of the liquid flow cell under vacuum may be significantly reduced (e.g., to about 30 nm or less). This may enable improved resolution and contrast in TEM images. Such liquid flow cells also may be reusable. Further, the fabrication methods described herein can be performed prior to the introduction of a liquid sample to the liquid flow cell and may require little or no assembly by the user.

The flow region in embodiments of the liquid flow cells described herein may include a nanofluidic channel etched in an oxide layer (e.g., silicon oxide) which is sandwiched between thin (e.g., about 50 nm thick) silicon nitride layers. The imaging region of a liquid flow cell may include patterned perforations (e.g., having dimensions of about 60 nm to 500 nm, or about 300 nm) in silicon nitride sealed by graphene. These graphene covered holes may serve as viewports for electron imaging. Prior to graphene sealing, the graphene covered holes may serve as etch vias for defining the nanofluidic channel in the silicon oxide.

Methods and Devices

FIG. 1 shows an example of a flow diagram illustrating a manufacturing process for a liquid flow cell. FIGS. 2A-2I show examples of schematic illustrations of a liquid flow cell at various stages in the manufacturing process shown in FIG. 1. In the method of fabricating a liquid flow cell, patterning techniques, including masking as well as etching processes, may be used to define the shapes of the different components of the liquid flow cell.

Starting at block 105 of the method 100 shown in FIG. 1, a first oxide layer is formed on a first surface of a substrate and a second oxide layer is formed on a second surface of the substrate. In embodiments, the first oxide layer and the second oxide layer are formed simultaneously. In some embodiments, the first oxide layer and the second oxide layer are formed in two separate process operations. In some embodiments, the substrate comprises a semiconductor. In some embodiments, the substrate comprises silicon. In some embodiments, the substrate comprises a double side polished semiconductor wafer. When the substrate comprises silicon, the oxide layer may be silicon oxide and the silicon oxide may be thermally grown on the silicon substrate. In some embodiments, the oxide may be deposited on the substrate using a chemical vapor deposition (CVD) technique or a physical vapor deposition (PVD) technique. In some embodiments, the substrate is about 150 microns to 450 microns thick, or about 300 microns thick. In some embodiments, dimensions of the first surface and the second surface of the substrate are about 2 millimeters (mm) to 8 mm by about 2 mm to 8 mm, or about 4 mm by about 6 mm. In some embodiments, the first and the second oxide layers are each about 50 nm to 300 nm thick, or about 200 nm thick.

At block 110 of the method 100, a first nitride layer is deposited on the first oxide layer and a second nitride layer is deposited on the second oxide layer. In some embodiments, the first nitride layer and the second nitride layer are deposited simultaneously. In some embodiments, the first nitride layer and the second nitride layer are deposited in two separate process operations. In some embodiments, the first and the second nitride layers are deposited with a CVD process or a low pressure CVD process. In some embodiments, the first and the second nitride layers comprise silicon nitride. When silicon nitride is deposited with low pressure CVD, the silicon nitride layer may be a layer having a high tensile stress. A layer of silicon nitride having a high tensile stress may be beneficial in later fabrication operations and may be less susceptible to buckling than a layer of silicon nitride having a low tensile stress. In some embodiments, the first and the second nitride layers are each about 20 nm to 60 nm thick, or about 40 nm thick.

Figure 2A:
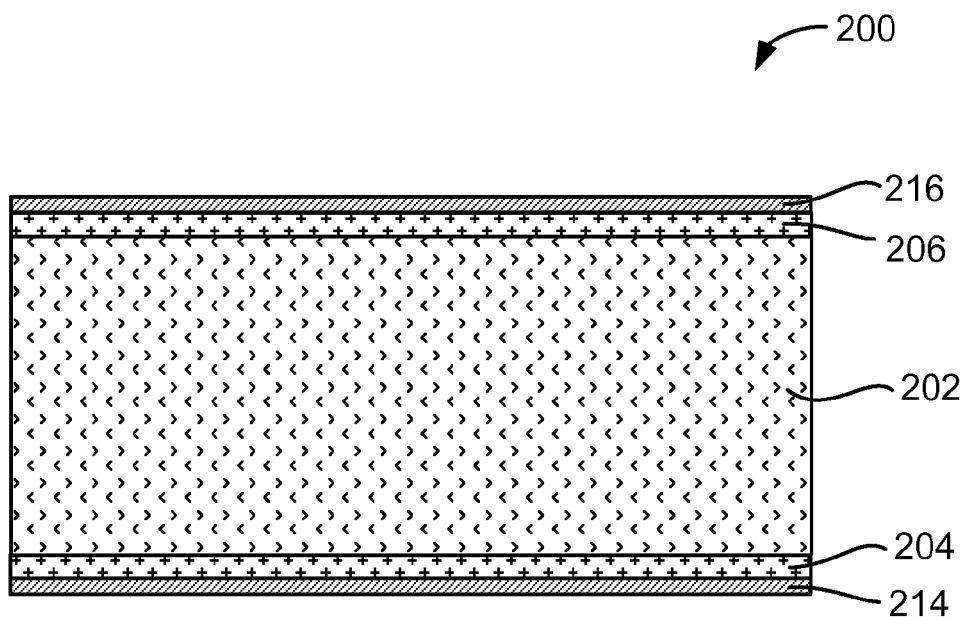
FIGS. 2A-2I show examples of schematic illustrations of a liquid flow cell at various stages in the manufacturing process.

FIG. 2A shows an example of a cross-sectional schematic illustration of a partially fabricated liquid flow cell 200 at this point (e.g., up through block 110) in the process 100. The liquid flow cell 200 includes a substrate 202, a first oxide layer 204, a second oxide layer 206, a first nitride layer 214, and a second nitride layer 216.

Returning to FIG. 1, at block 115, a portion of the first nitride layer and the first oxide layer is removed. In some embodiments, the portion of the first nitride layer and the first oxide layer removed has dimensions of about 200 microns to 500 microns by about 200 microns to 500 microns, about 400 microns square, or about 200 microns by about 400 microns. In some embodiments, this is performed by etching the first nitride layer and then etching the first oxide layer. In some embodiments, etching the first nitride layer and etching the first oxide layer is performed with a dry etching process.

Figure 2B:
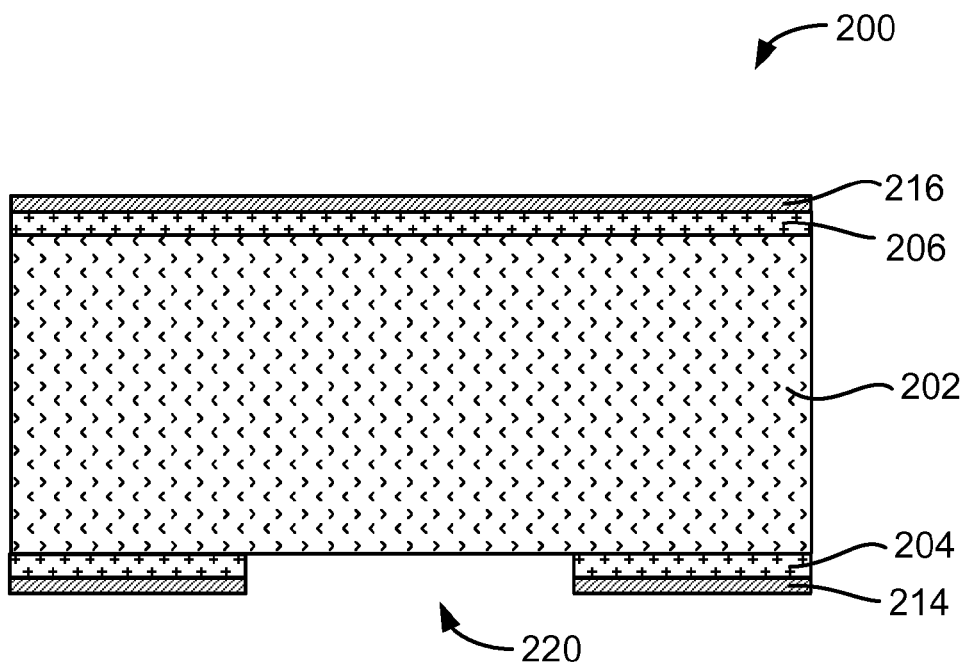

FIG. 2B shows an example of a cross-sectional schematic illustration of the partially fabricated liquid flow cell 200 at this point (e.g., up through block 115) in the process 100. The liquid flow cell 200 includes a region 220 where the first oxide layer 204 and the first nitride layer 214 have been removed.

Returning to FIG. 1, at block 120, a cavity is formed in the substrate to expose the second oxide layer. For example, a first side of the second oxide layer may be disposed on the substrate, and a portion of the substrate may be removed to expose the first side of the second oxide layer. In some embodiments, the cavity is formed by etching the substrate to expose the second oxide layer. In some embodiments, etching the substrate is performed with a wet etching process (e.g., a potassium hydroxide (KOH) etch or a tetramethylammonium hydroxide (TMAH) etch when the substrate comprises silicon). A KOH etch will etch the second oxide layer, so the etch duration may be timed when using a KOH etch so as to not etch the second oxide layer too much. A TMAH etch will not etch the second oxide layer.

Figure 2C:
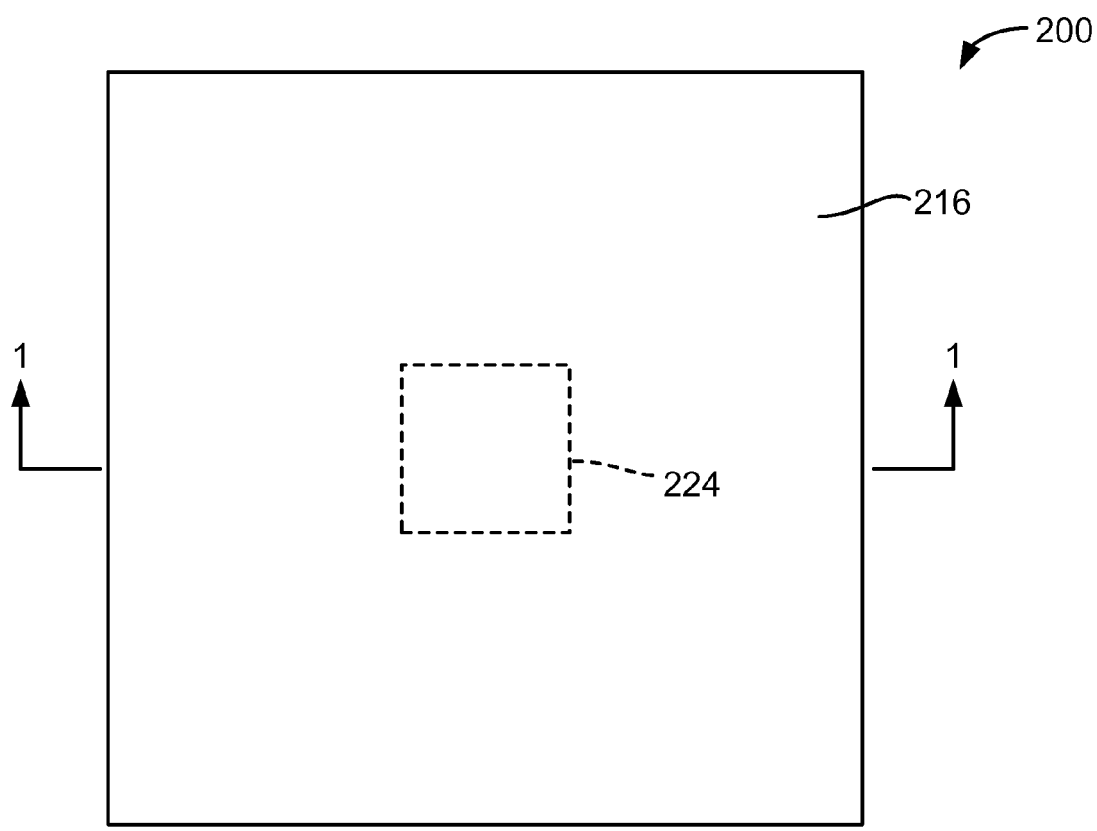
Figure 2D:
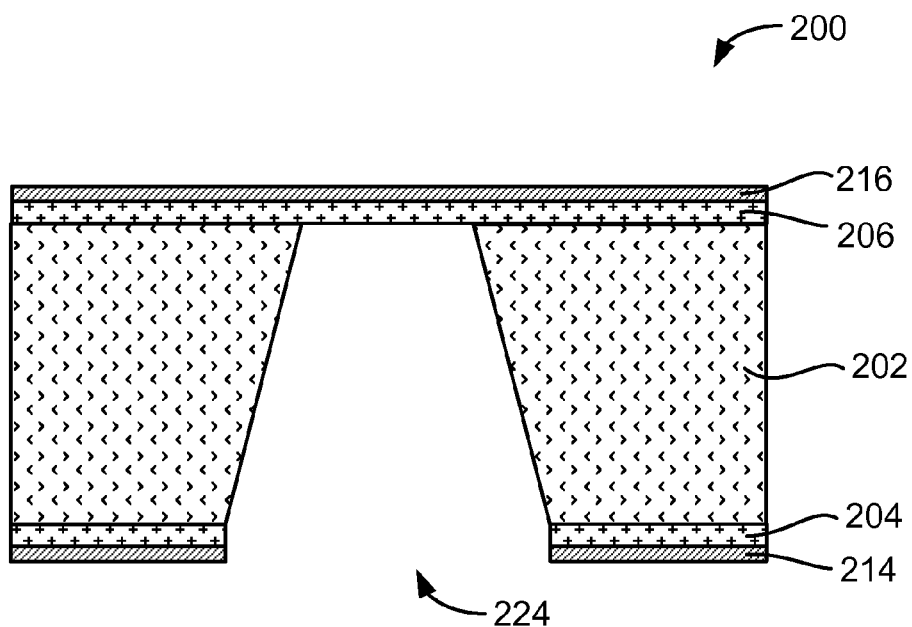

FIGS. 2C and 2D show examples of schematic illustrations of the partially fabricated liquid flow cell 200 at this point (e.g., up through block 120) in the process 100. FIG. 2C shows an example of a top-down schematic illustration of the liquid flow cell 200, and FIG. 2D shows an example of a cross-sectional schematic illustration of the liquid flow cell 200 through line 1-1 of FIG. 2C. The liquid flow cell 200 includes a cavity 224 in the substrate 202 exposing the second oxide layer 206. For example, a first side of the second oxide layer 206 may be disposed on the substrate 202 and the cavity 224 in the substrate 202 may expose the first side of the second oxide layer 206. FIG. 2C shows the area of the cavity 224 proximate the second oxide layer 206 as projected onto the second nitride layer 216.

Returning to FIG. 1, at block 125, a third nitride layer is deposited on the first nitride layer, substrate walls of the cavity, and the second oxide layer (e.g., the first side of the second oxide layer). In some embodiments, the third nitride layer is deposited with a CVD process or a low pressure CVD process. In some embodiments, the third nitride layer comprises silicon nitride. In some embodiments, the first nitride layer, the second nitride layer, and the third nitride layer all comprise the same nitride (e.g., silicon nitride). In some embodiments, the third nitride layer is about 20 nm to 60 nm thick, or about 40 nm thick. In some embodiments, the third nitride layer is thick enough so that it forms a continuous layer. In some embodiments, the third nitride layer is also deposited on the second nitride layer, adding to the thickness of the second nitride layer.

Figure 2E:
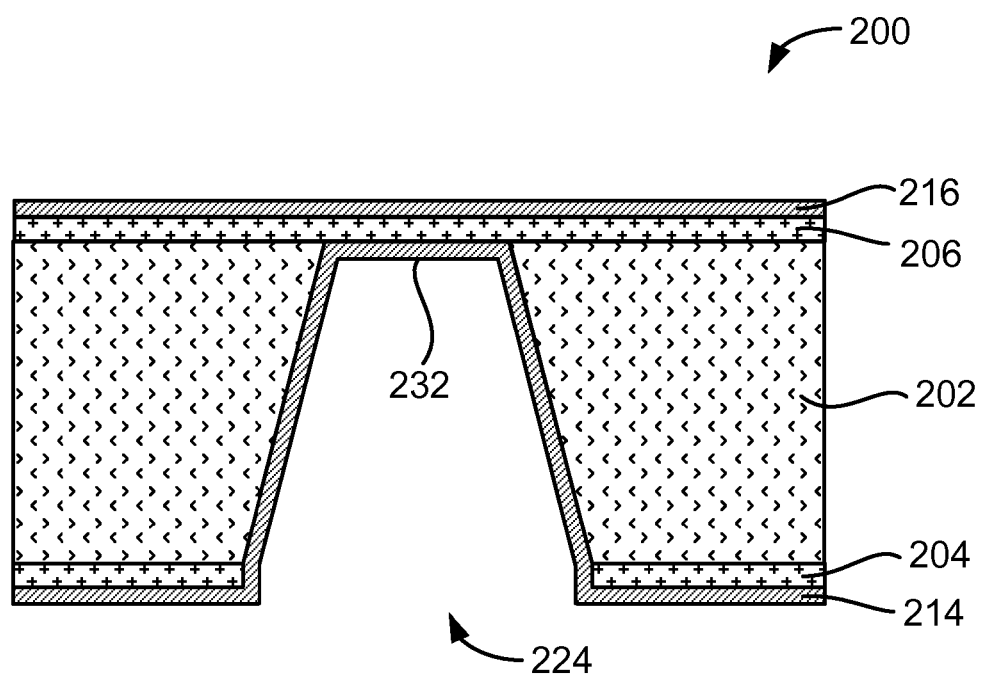

FIG. 2E shows an example of a cross-sectional schematic illustration of the partially fabricated liquid flow cell 200 at this point (e.g., up through block 125) in the process 100. The liquid flow cell 200 includes a third nitride layer 232 disposed on the second oxide layer 206 (e.g., the first side of the second oxide layer 206) and walls of the substrate 202 that define the cavity 224. The third nitride layer 232 is not shown as being disposed on the first nitride layer 214 as in some embodiments, the first nitride layer 214 and the third nitride layer 232 may comprise the same nitride and together may form a nitride layer.

Returning to FIG. 1, at block 130, an inlet port, an outlet port, and a plurality of viewports between the inlet port and the outlet port are formed in the second nitride layer. At least some of the plurality of viewports are positioned to be opposite the cavity; that is, at least some of the plurality of viewports overlie (or underlie, depending on the orientation of the liquid flow cell) the cavity. In some embodiments, the inlet port, the outlet port, and the plurality of viewports are formed in the second nitride layer with a lithography process (e.g., electron beam lithography) and a reactive ion etch (RIE) process. In some embodiments, the inlet port, the outlet port, and the plurality of viewports are formed in the second nitride layer using ion milling. In some embodiments, the inlet port, the outlet port, and the plurality of viewports have a circular shape. In some embodiments, the inlet port, the outlet port, and the plurality of viewports have dimensions (e.g., a diameter) of about 60 nm to 500 nm, about 60 nm to 120 nm, or about 80 nm to 100 nm. Viewports with smaller diameters may be less susceptible to the graphene covering the viewports (see block 140) bowing into or out of the viewports under vacuum. In some embodiments, dimensions of the inlet port and the outlet port are larger than dimensions of a view port. In some embodiments, the plurality of viewports includes about 10 viewports to 100 viewports, about 20 viewports to 90 viewports, or about 50 viewports. In some embodiments, a spacing between viewports of the plurality of viewports is about 250 nm to 1 micron.

Figure 2F:
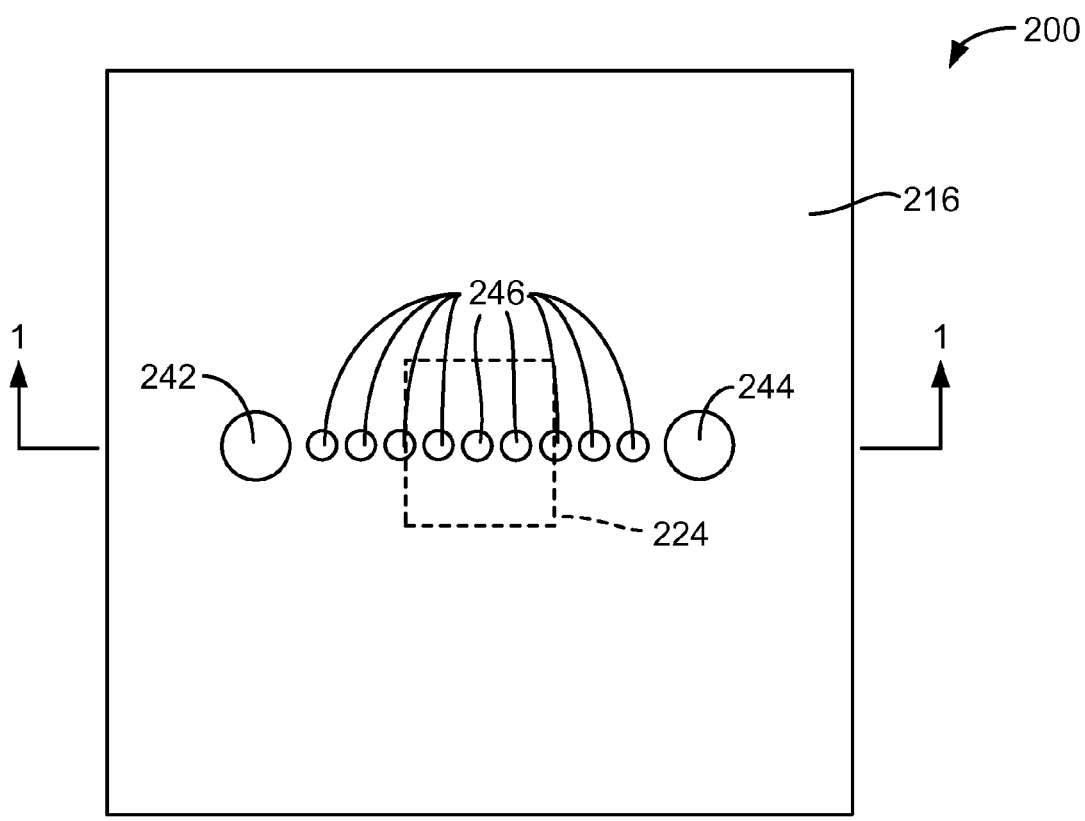
Figure 2G:
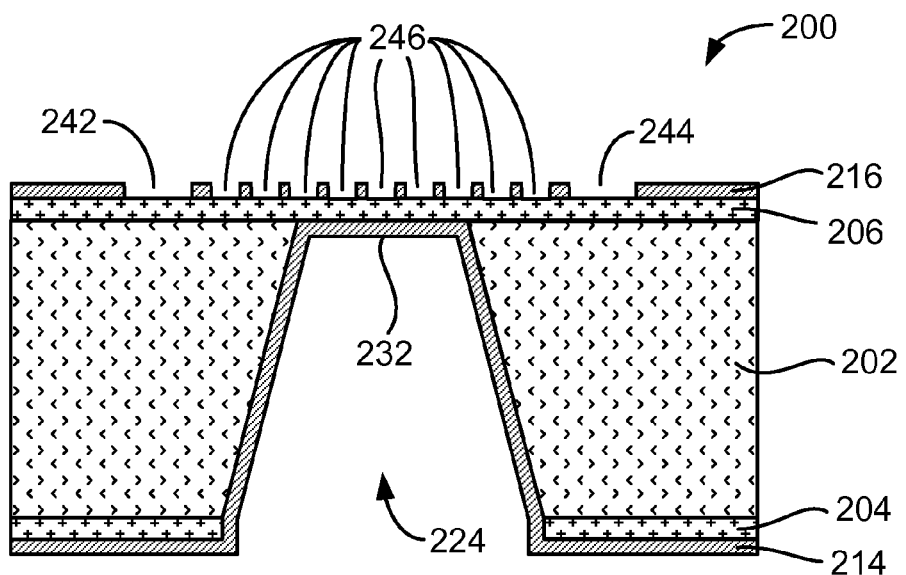

FIGS. 2F and 2G show examples of schematic illustrations of the partially fabricated liquid flow cell 200 at this point (e.g., up through block 130) in the process 100. FIG. 2F shows an example of a top-down schematic illustration of the liquid flow cell 200, and FIG. 2G shows an example of a cross-sectional schematic illustration of the liquid flow cell 200 through line 1-1 of FIG. 2F. The liquid flow cell 200 includes an inlet port 242, an outlet port 244, and a plurality of viewports 246 defined in the second nitride layer 216. FIG. 2G shows the area of the cavity 224 as projected onto the second nitride layer 216, with at least some of the plurality of viewports positioned over the cavity 224.

Returning to FIG. 1, at block 135, a portion of the second oxide layer is removed to form a channel from the inlet port to the outlet port. In some embodiments, this is performed with an etching process. In some embodiments, the etching process is a wet etching process (e.g., a hydrofluoric (HF) acid etch). In some embodiments, the plurality of viewports provide access to the second oxide layer between the inlet port and the outlet port.

Figure 2H:
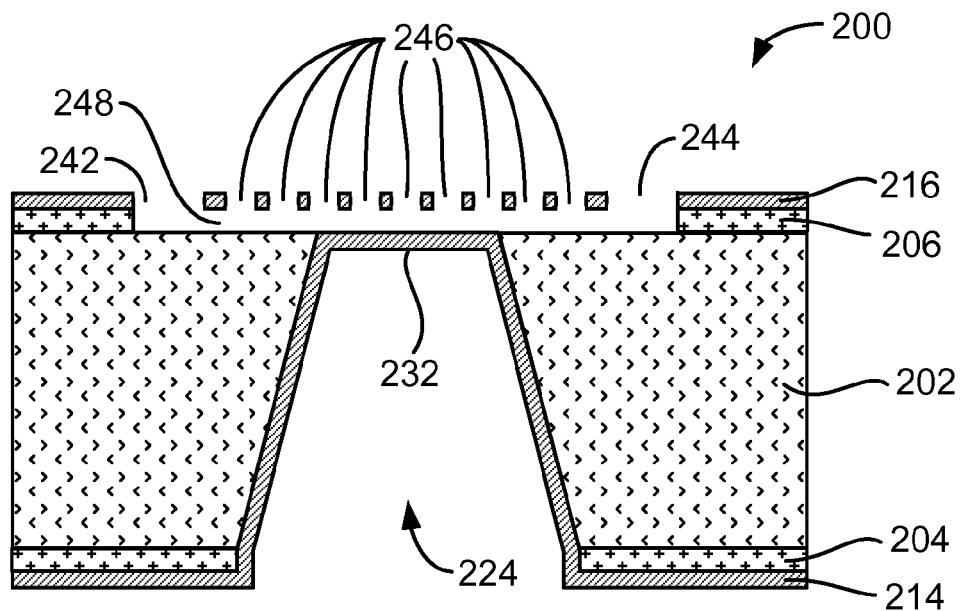

FIG. 2H shows an example of a cross-sectional schematic illustration of the partially fabricated liquid flow cell 200 at this point (e.g., up through block 135) in the process 100. The liquid flow cell 200 includes a channel 248 in the second oxide layer 206 between the inlet port 242 and the outlet port 244. The channel 248 is defined by the third nitride layer 232 and the second nitride layer 216 as shown in FIG. 2H. Into and out of the plane of the page of FIG. 2H, the channel 248 also is defined by second oxide layer 206. The channel 248 also underlies the plurality of viewports 246. In some embodiments, the channel 248 has cross-sectional dimensions of about 50 nm to 300 nm (e.g., a thickness of the second oxide layer 206 that was removed) by about 500 nm to 2 microns (e.g., a width of the channel defined by the second oxide layer 206 into and out of the plane of the page of FIG. 2H), or about 200 nm (e.g., a thickness of the second oxide layer 206 that was removed) by 1 micron (e.g., a width of the channel defined by the second oxide layer 206 into and out of the plane of the page of FIG. 2H). In some embodiments, a length of the channel 248 between the inlet port 242 and the outlet port 244 is about 50 microns to 1.5 mm. In some embodiments, a channel 248 with larger cross-sectional dimensions will aid in the flow of the liquid in the channel. In some embodiments, a channel 248 with smaller cross-sectional dimensions (e.g., a smaller thickness through which an electron beam travels) will provide for higher resolution TEM.

Returning to FIG. 1, at block 140, a graphene sheet is positioned on the second nitride layer (e.g., the graphene sheet being positioned on a second side of the second nitride layer, with a first side of the second nitride layer being disposed on a second side of the second oxide layer) to cover the plurality of viewports. In some embodiments, the graphene sheet comprises a single layer of graphene. In some embodiments, the graphene sheet comprises multiple layers of graphene.

For example, in some embodiments, the graphene is grown on copper using a CVD process. A thin poly(methyl methacrylate) (PMMA) solution may be deposited (e.g., spin coated) on the graphene. In some embodiments, a 10 nm to 20 nm thick layer of PMMA is deposited on the graphene. The PMMA may increase the structural integrity as well as the flexibility of the graphene and aid in ensuring successful transfer of the graphene onto the second nitride layer.

Then, the copper may be etched (e.g., with a sodium persulphate solution). The graphene may be washed in several deionized (DI) water baths. In some embodiments, the graphene is transferred onto the second nitride layer with the graphene contacting the second nitride layer. In some embodiments, the transfer process is a wet transfer process or a dry transfer process. When the transfer process is a wet transfer process, critical point drying may be used. In some embodiments, the PMMA is then removed (e.g., using an acetone solution or forming gas). In some embodiments, the graphene seals the plurality of viewports.

In some embodiments, in addition to covering the plurality of viewports, the graphene may cover the inlet port and/or the outlet port. When the graphene covers the inlet port or the outlet port, the graphene is patterned to remove the graphene from the inlet port or the outlet port before the PMMA is removed. Also, when electrodes are disposed on the second silicon nitride layer (see FIG. 5), the graphene may be patterned so that the graphene does not contact an electrode.

Figure 2I:
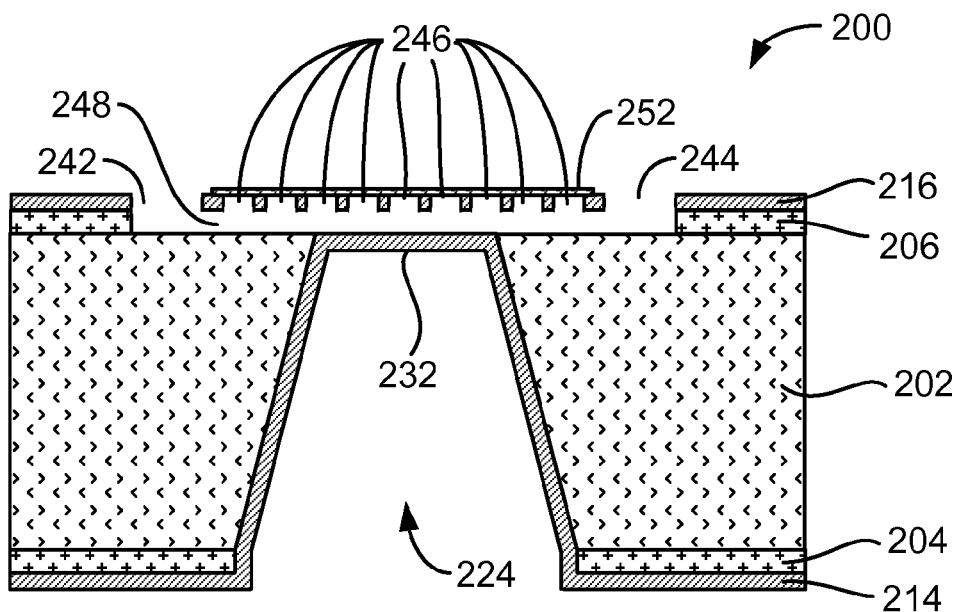

FIG. 2I shows an example of a cross-sectional schematic illustration of the liquid flow cell 200 at this point (e.g., up through block 140) in the process 100. The liquid flow cell 200 includes a substrate 202, the substrate 202 having a first surface and a second surface. A first oxide layer 204 is disposed on the first surface of the substrate 202 and a second oxide layer 206 is disposed the second surface of the substrate 202. A first nitride layer 214 is disposed on the first oxide layer 204 and a second nitride layer 216 is disposed on the second oxide layer 206. A cavity 224 is defined in the first oxide layer 204, the first nitride layer 214, and the substrate 202. The cavity 224 includes a third nitride layer 232 disposed on walls of the substrate 202 that define the cavity 224. A channel 248 is defined in the second oxide layer 206. The channel 248 is also defined by the second nitride layer 216, the third nitride layer 216, and a graphene sheet 252. An inlet port 242 and an outlet port 244 are defined in the second nitride layer 216 and in fluid communication with the channel 248. A plurality of viewports 246 are defined in the second nitride layer 216 and positioned between the inlet port 242 and the outlet port 244. At least some of the plurality of viewports are positioned opposite the cavity 224. The graphene sheet 252 is disposed on the second nitride layer 216 and covers the plurality of viewports 246. In some embodiments, the graphene sheet 252 comprises a monolayer of graphene. In some embodiments, the graphene sheet 252 comprises a few layers of graphene.

The liquid flow cell 200 shown in FIG. 2I may be used for TEM when the TEM sample holder is configured to accept the liquid flow cell 200. For example, the TEM sample holder may have a tube for liquid delivery to the inlet port 242 and a tube to accept liquid from the outlet port 244. As another example, a portion of the liquid flow cell 200 including the inlet port 242 could be isolated from the vacuum of a TEM with polymer gaskets (e.g., a fluoropolymer elastomer gasket). Similarly, a portion of the liquid flow cell 200 including the outlet port 244 could be isolated from the vacuum of a TEM with polymer gaskets. Liquid could then be introduced to the portion of the liquid flow cell 200 including the inlet port 242. The positions and orientations of the different components of a liquid flow cell 200 can be altered so that the liquid flow cell is able to be used with a specific TEM sample holder.

The liquid can be imaged with the liquid flow cell 200, with an electron beam being transmitted though the graphene sheet 252, the liquid, and the third nitride layer 232. When using the liquid flow cell 200 for TEM, liquid could be continuously input into the inlet port 242 such that there is a flow of liquid through the channel 248 when an image is generated. Alternatively, liquid could be input into the inlet port 242 so that it fills the channel 248 and then an image generated. The liquid may not be exposed to the ultrahigh vacuum of a TEM due to the liquid being confined to the liquid flow cell while it is being imaged.

The orientation of the liquid flow cell 200 in a microscope may depend on the sample being imaged and on the configuration of the TEM sample holder. For example, if a biological sample is being imaged in a TEM, the liquid flow cell 200 may be oriented so that the electron beam impinges on the third nitride layer 232, interacts with the liquid, and then impinges the graphene sheet 252. The third nitride layer 232 may diffuse the energy of the electron beam and aid in preventing damage to the sample.

Variations of and/or additions to the method 100 are possible. For example, a flow cell may be fabricated by depositing a nitride layer on both sides of a substrate, depositing an oxide layer on one of the nitride layers, and then depositing a nitride layer on the oxide layer. The oxide layer between the two nitride layers can be used to fabricate a channel with viewports, similar to the liquid flow cell 200 shown in FIG. 2. A fabrication method of a liquid flow cell having a nitride layer/oxide layer/nitride layer may include process operations similar to process operations described with respect to the method 100 described in FIG. 1.

Figure 2J:
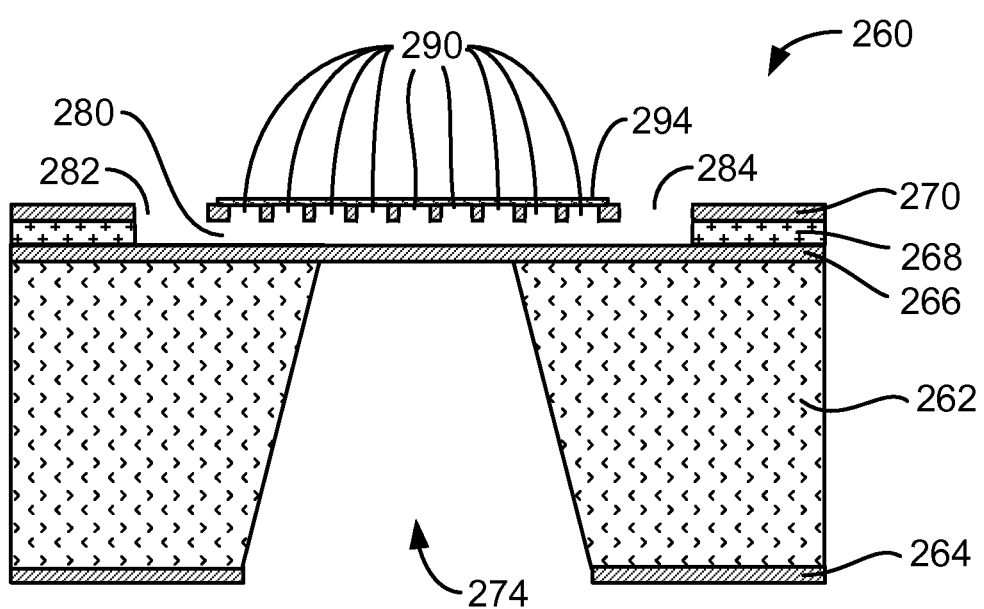
FIG. 2J shows an example of a cross-sectional schematic illustration of a liquid flow cell.

FIG. 2J shows an example of a cross-sectional schematic illustration of a liquid flow cell 260 fabricated with such a process. The liquid flow cell 260 includes a substrate 262, the substrate 262 having a first surface and a second surface. A first nitride layer 264 is disposed on the first surface of the substrate 262 and a second nitride layer 266 is disposed on the second surface of the substrate 262. A first side of an oxide layer 268 is disposed on the second nitride layer 266. A third nitride layer 270 is disposed on a second side of the oxide layer 268. A cavity 274 is defined in the first nitride layer 264 and the substrate 262. In some embodiments, the substrate 262 and the second nitride layer 266 define cavity 274; that is, in some embodiments, the second nitride layer 266 defines a surface of the cavity 274. A channel 280 is defined in the oxide layer 268. A width of the channel defined by the oxide layer 268 into and out of the plane of the page of FIG. 2J. The channel 280 is also defined by the first nitride layer 264, the second nitride layer 266, and a graphene sheet 294. An inlet port 282 and an outlet port 284 are defined in the third nitride layer 270 and in fluid communication with the channel 280. A plurality of viewports 290 are defined in the third nitride layer 270 and positioned between the inlet port 282 and the outlet port 284. At least some of the plurality of viewports 290 are positioned opposite the cavity 274. The graphene sheet 294 is disposed on the third nitride layer 270 and covers the plurality of viewports 290. Dimensions of the liquid flow cell 260 may be similar to dimensions of the liquid flow cell 200 described in FIGS. 2A-2I.

Figure 3:
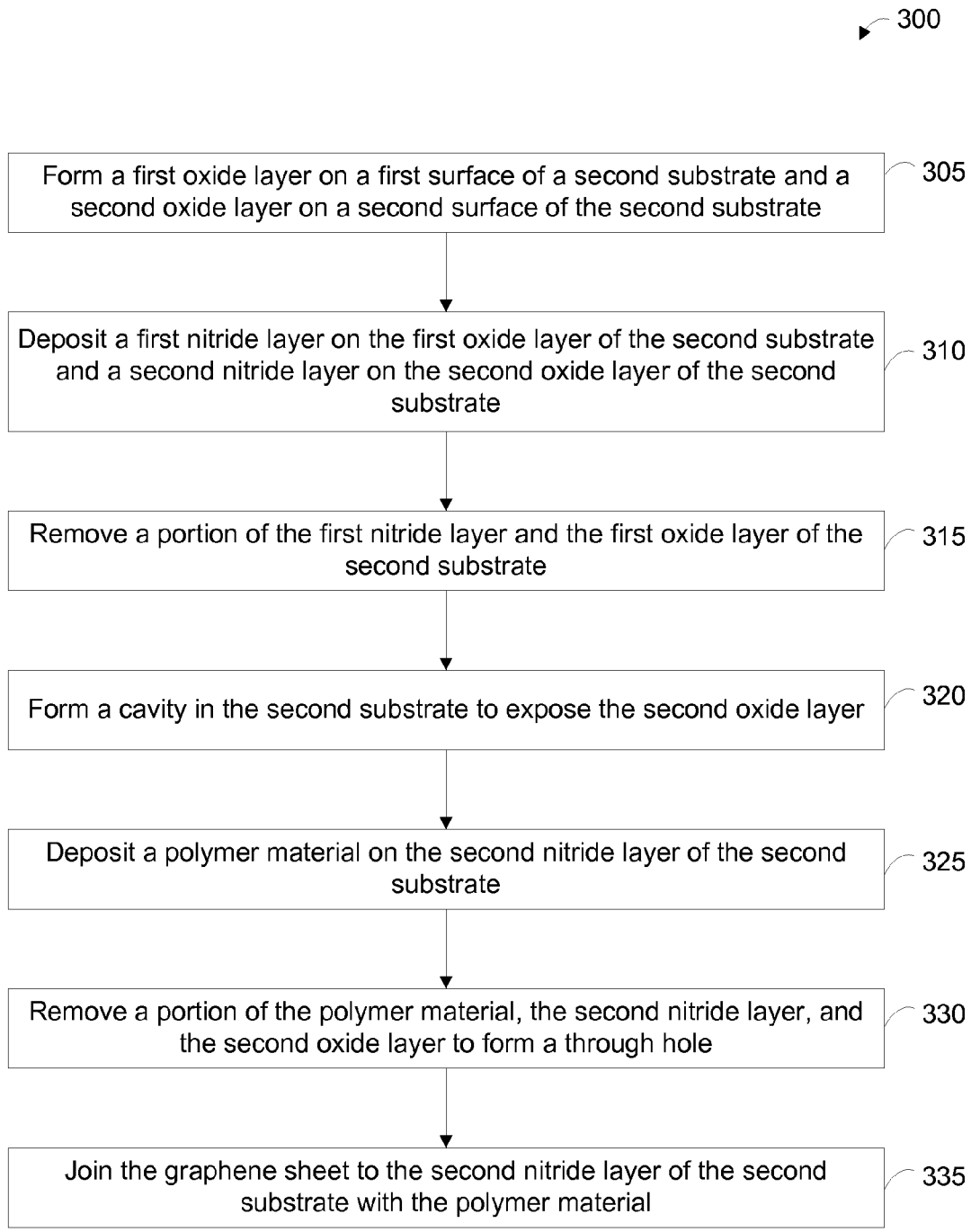
FIG. 3 shows an example of a flow diagram illustrating a manufacturing process for a liquid flow cell having a top plate.

As another example, in some embodiments, the liquid flow cell 200 may need to be thicker for it to fit into a TEM sample holder. In some embodiments, thickness of the liquid flow cell 200 may be increased by joining the liquid flow cell 200 to a second plate. FIG. 3 shows an example of a flow diagram illustrating a manufacturing process for a liquid flow cell having a second plate. Specifically, FIG. 3 shows an example of a flow diagram illustrating a manufacturing process for a second plate and joining the second plate to a liquid flow cell as fabricated with the method 200 shown in FIG. 2. Portions of the manufacturing process for a second plate may be similar to the manufacturing process for a liquid flow cell. FIGS. 4A-4G show examples of schematic illustrations of a liquid flow cell having a top plate at various stages in the manufacturing process.

Starting at block 305 of the method 300 shown in FIG. 3, a first oxide layer is formed on a first surface of a second substrate and a second oxide layer is formed on a second surface of the second substrate. In some embodiments, the second substrate comprises a semiconductor. In some embodiments, the second substrate comprises silicon. In some embodiments, the second substrate comprises a double side polished semiconductor wafer. When the second substrate comprises silicon, the oxide layer may be silicon oxide and the silicon oxide may be thermally grown on the silicon substrate. In some embodiments, the oxide may be deposited on the substrate using a CVD technique or a PVD technique. In some embodiments, the substrate is about 150 microns to 450 microns thick, or about 300 microns thick. In some embodiments, dimensions of the first surface and the second surface of the substrate are about 2 mm to 8 mm by about 2 mm to 8 mm, or about 2 mm by about 2 mm. In some embodiments, the first and the second oxide layers are each about 50 nm to 300 nm thick, or about 200 nm thick.

At block 310 of the method 300, a first nitride layer is deposited on the first oxide layer of the second substrate and a second nitride layer is deposited on the second oxide layer of the second substrate. In some embodiments, the first and the second nitride layers are deposited with a CVD process or a low pressure CVD process. In some embodiments, the first and the second nitride layers comprise silicon nitride. In some embodiments, the first and the second nitride layers are each about 20 nm to 60 nm thick, or about 40 nm thick.

Figure 4A:
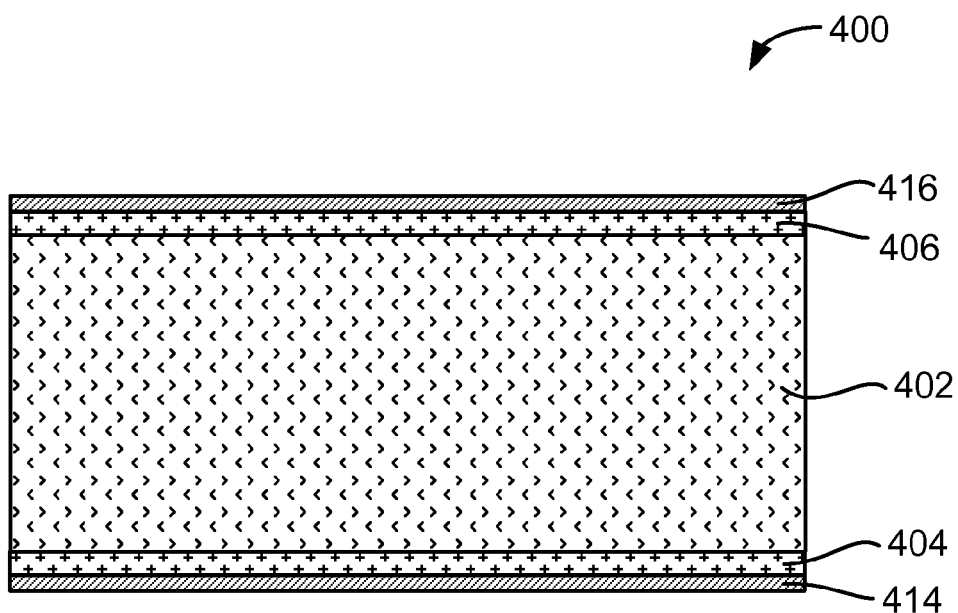
FIGS. 4A-4G show examples of schematic illustrations of a liquid flow cell having a top plate at various stages in the manufacturing process.

FIG. 4A shows an example of a cross-sectional schematic illustration of a partially fabricated second plate 400 at this point (e.g., up through block 310) in the method 300. The second plate 400 includes a substrate 402, a first oxide layer 404, a second oxide layer 406, a first nitride layer 414, and a second nitride layer 416.

Returning to FIG. 3, at block 315, a portion of the first nitride layer and the first oxide layer of the second substrate is removed. In some embodiments, the portion of the first nitride layer and the first oxide layer removed has dimensions of about 200 microns to 500 microns by about 200 microns to 500 microns, about 400 microns square, or about 200 microns by about 400 microns. In some embodiments, this is performed by etching the first nitride layer and then etching the first oxide layer. In some embodiments, etching the first nitride layer and etching the first oxide layer is performed with a dry etching process.

Figure 4B:
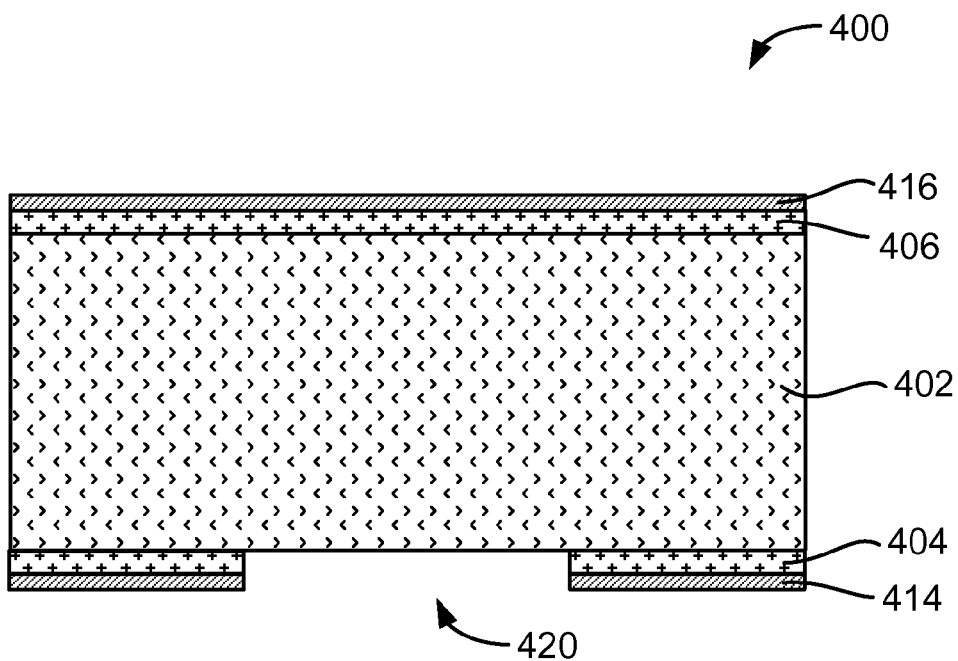

FIG. 4B shows an example of a cross-sectional schematic illustration of the partially fabricated second plate 400 at this point (e.g., up through block 315) in the method 300. The second plate 400 includes a region 420 where the first oxide layer 404 and the first nitride layer 414 have been removed.

Returning to FIG. 3, at block 320, a cavity is formed in the second substrate to expose the second oxide layer. For example, a first side of the second oxide layer may be disposed on the substrate, and a portion of the substrate may be removed to expose the first side of the second oxide layer. In some embodiments, the cavity is formed by etching the substrate to expose the second oxide layer. In some embodiments, etching the substrate is performed with a wet etching process (e.g., a KOH etch or a TMAH etch when the substrate comprises silicon).

Figure 4C:
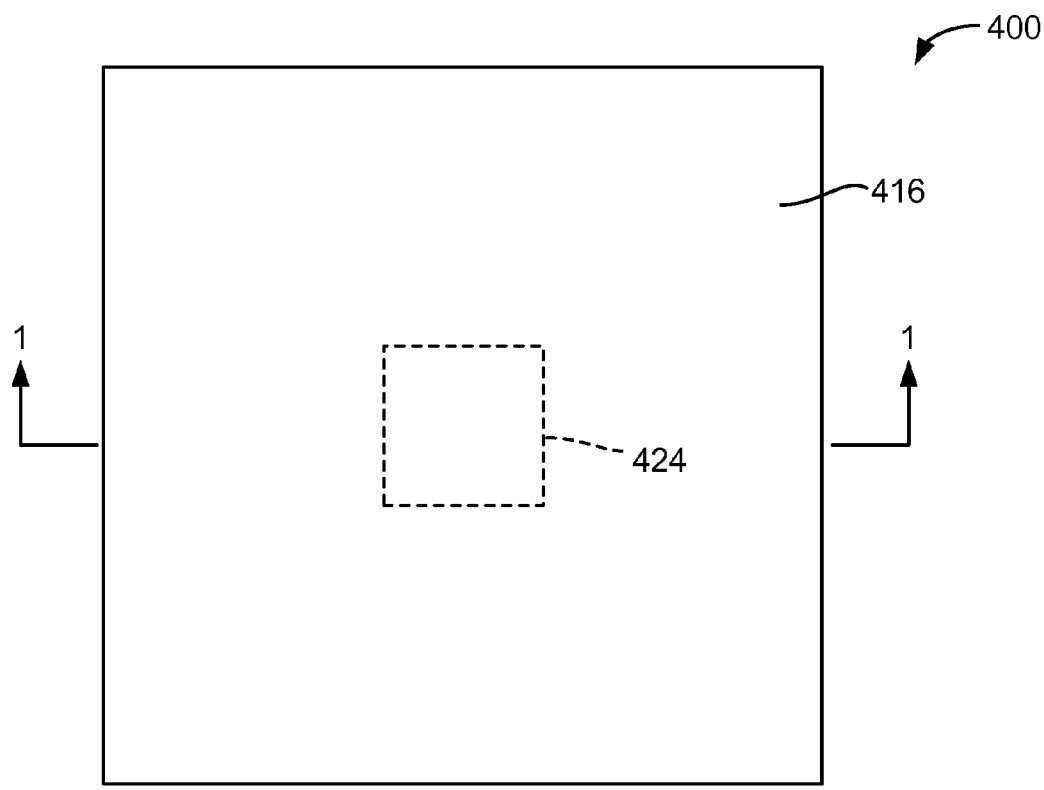
Figure 4D:
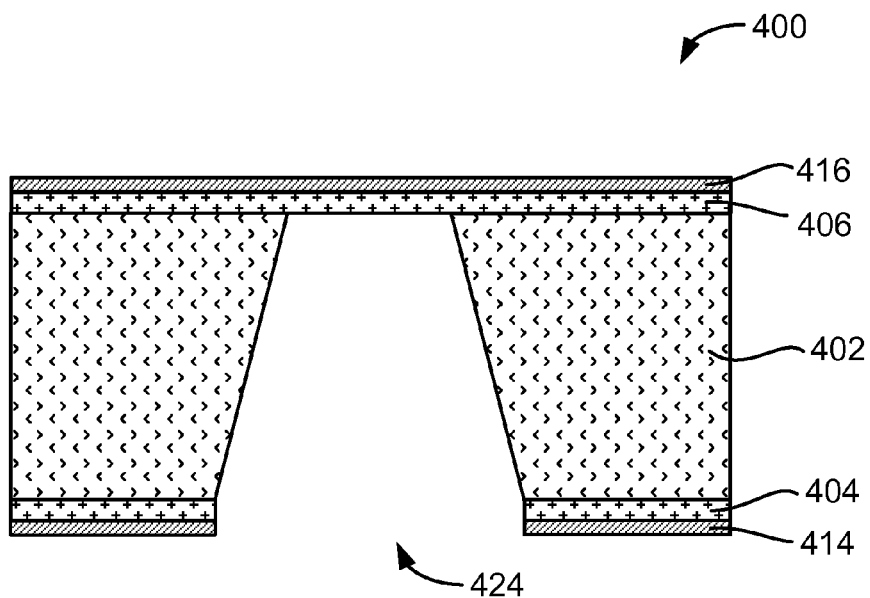

FIGS. 4C and 4D show examples of schematic illustrations of the partially fabricated second plate 400 at this point (e.g., up through block 320) in the method 300. FIG. 4C shows an example of a top-down schematic illustration of the second plate 400, and FIG. 4D shows an example of a cross-sectional schematic illustration of the second plate 400 through line 1-1 of FIG. 4C. The second plate 400 includes a cavity 424 in the second substrate 402 exposing the second oxide layer 406. For example, a first side of the second oxide layer 406 may be disposed on the substrate 402 and the cavity 424 in the substrate 402 may expose the first side of the second oxide layer 406. FIG. 4C shows the area of the cavity 424 proximate the second oxide layer 406 as projected onto the second nitride layer 416.

Returning to FIG. 3, at block 325, a polymer material is deposited on the second nitride layer of the second plate. In some embodiments, the polymer material is deposited so that it covers the area of the cavity 424 proximate the second oxide layer 406 as projected onto the second nitride layer 406. In some embodiments, the polymer material is a photoresist (e.g., an epoxy-based negative photoresist, such as SU-8, or an epoxy-based photoresist). In some embodiments, the polymer material is deposited with a spin coating process. In some embodiments, a thickness of the polymer material is about 2 microns to 8 microns, or about 5 microns.

Figure 4E:
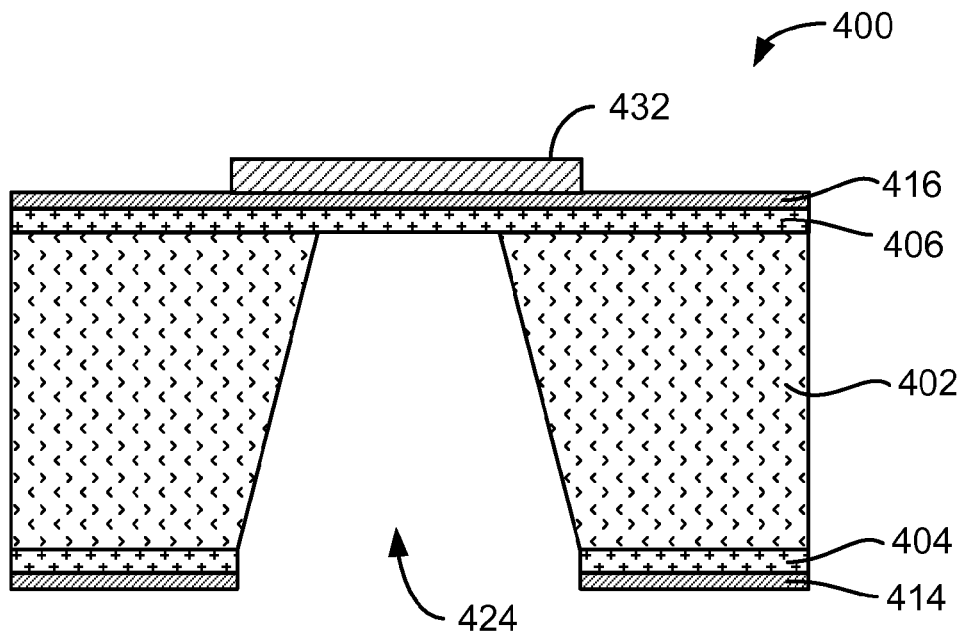

FIG. 4E shows an example of a cross-sectional schematic illustration of the partially fabricated second plate 400 at this point (e.g., up through block 325) in the method 300. The second plate 400 includes a polymer material 432 disposed on the second nitride layer 416.

Returning to FIG. 3, at block 330, a portion of the polymer material, the second nitride layer, and the second oxide layer are removed to form a through hole. In some embodiments, this performed by first patterning the polymer material and then the second oxide layer is removed (e.g., using a buffered oxide etch (BOE)) and the second nitride layer is removed (e.g., using a RIE process or ion milling) to form the though hole. In some embodiments, the second oxide layer and the second nitride layer are removed with a dry etching process.

Figure 4F:
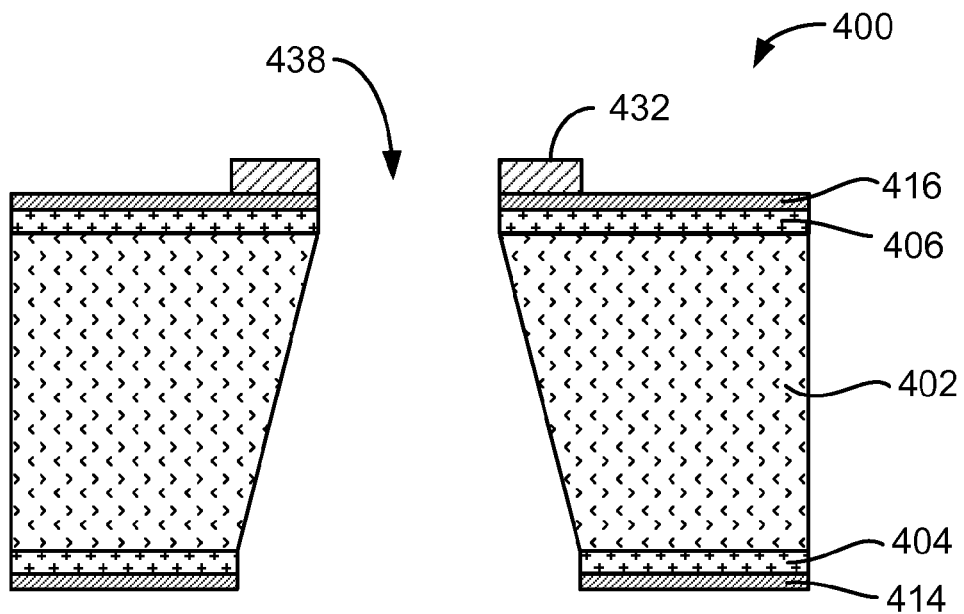

FIG. 4F shows an example of a cross-sectional schematic illustration of the partially fabricated second plate 400 at this point (e.g., up through block 330) in the process 300. The second plate comprises the second substrate 402 having a first surface and a second surface. The first oxide layer 404 is disposed on the first surface of the second substrate 402 and the second oxide layer 406 is disposed on the second surface of the second substrate 402. The first nitride layer 414 is disposed on the first oxide layer 404 and the second nitride layer 416 is disposed on the second oxide layer 406. The polymer material 432 is disposed on the second nitride layer 416. The second plate 400 defines a through hole 438 through the first nitride layer 414, the first oxide layer 404, the second substrate 402, the second oxide layer 406, the second nitride layer 416, and the polymer layer 432.

Returning to FIG. 3, at block 335, the second plate is joined with a liquid flow cell using the polymer material. In some embodiments, the graphene sheet of a liquid flow cell fabricated according to the method 200 shown in FIG. 2 is joined to the second nitride layer of the second plate with the polymer material. In some embodiments, the graphene sheet and the second nitride layer of a liquid flow cell fabricated according to the method 200 shown in FIG. 2 are joined to the second nitride layer of the second plate with the polymer material. The cavity of the substrate of the liquid flow cell is aligned with the though hole of the second substrate. Heat and pressure may be used to join the liquid flow cell to the second plate.

Figure 4G:
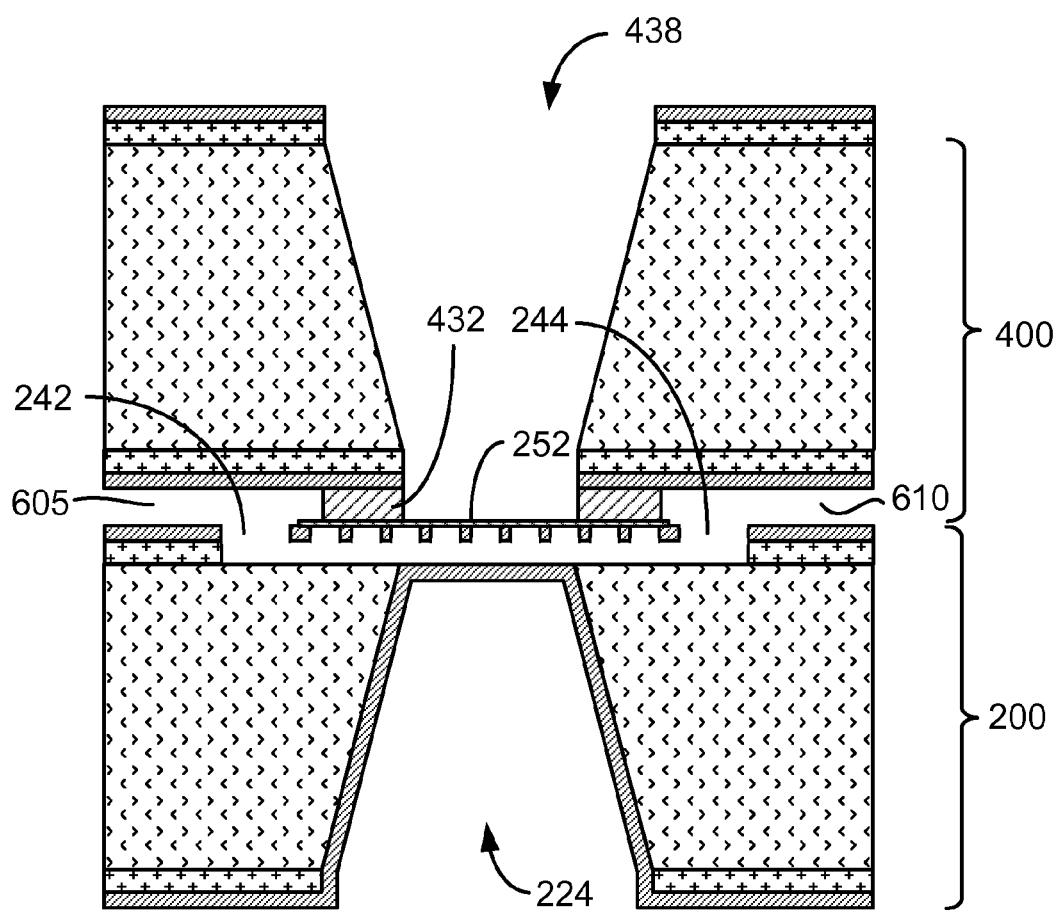

FIG. 4G shows an example of a cross-sectional schematic illustration of the liquid flow cell 200 and the second plate 400 at this point (e.g., up through block 335) in the method 300. The second plate 400 is joined to the liquid flow cell 200 with the polymer material 432. For example, as shown in FIG. 4G, in some embodiments, the graphene sheet 252 of the liquid flow cell 200 and the second nitride layer 416 of the second plate 400 are joined with the polymer material 432. In some embodiments, the nitride layer (i.e., the nitride layer having the graphene sheet disposed thereon) and the graphene sheet 252 of the liquid flow cell 200 and the second nitride layer 416 of the second plate 400 are joined with the polymer material 432. In some embodiments, the nitride layer (i.e., the nitride layer having the graphene sheet disposed thereon) of the liquid flow cell 200 and the second nitride layer 416 of the second plate 400 are joined with the polymer material 432. The through hole 438 in the second plate 400 is aligned with the cavity 224 of the liquid flow cell 200. That is, the liquid flow cell 200 and the second plate 400 are aligned so that an electron beam can be transmitted through the graphene sheet 252, a liquid in the channel, and the third nitride layer of the liquid flow cell.

In some embodiments, the liquid flow cell 200 and the second plate 400 define an inlet channel 605 connected to (or in fluid communication with) the inlet port 242 and an outlet channel 610 connected to (or in fluid communication with) the outlet port 244. In some embodiments, the polymer material 432 is disposed proximate a perimeter of the cavity 224 (as projected on a surface) in the liquid flow cell 200 and a perimeter of the through hole 438 (as projected on a surface) in the second plate 400.

A liquid flow cell can be further modified. For example, in some embodiments, a liquid flow cell includes electrodes so that electrical contact can be made with the liquid at the inlet port and at the outlet port of the liquid flow cell. Such electrodes may be used to apply a voltage or a current to a liquid when imaging the liquid or to aid in or cause particles in the liquid to flow due to electrophoresis. Such electrodes also may be used to apply a voltage or a current to a liquid to aid in or cause the liquid to flow.

Figure 5:
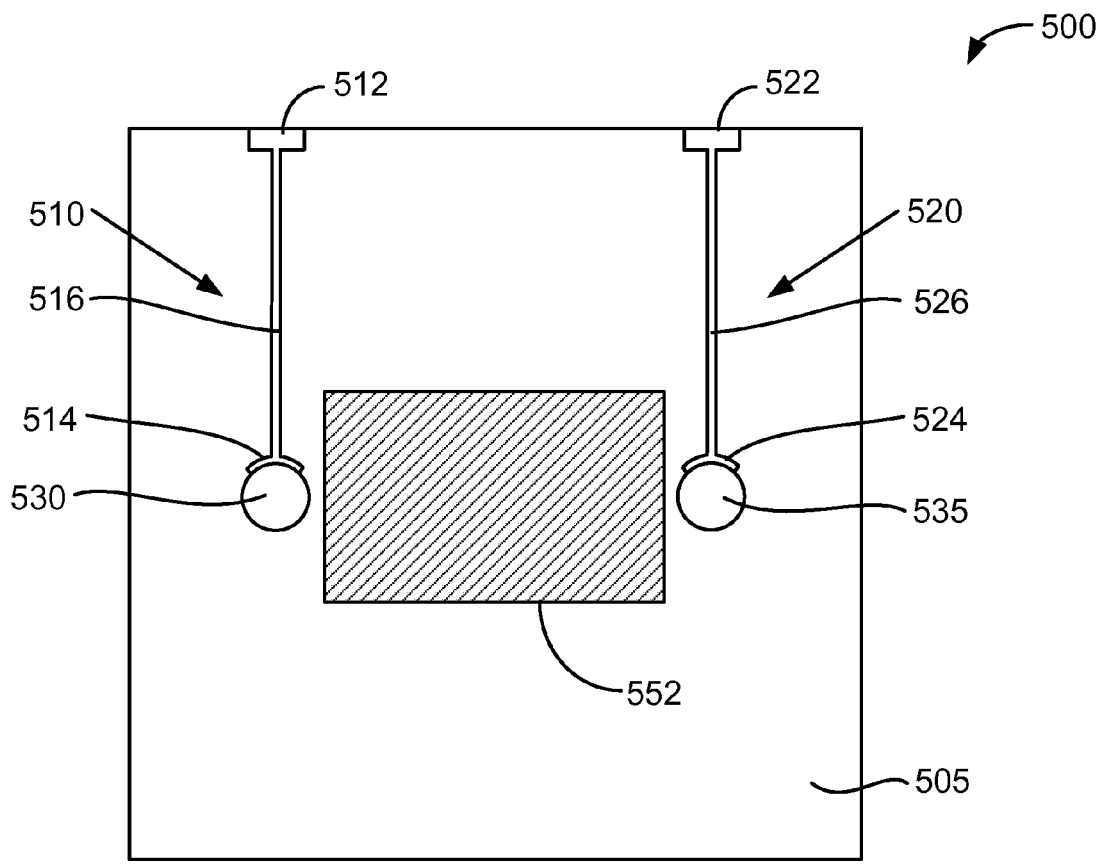
FIG. 5 shows an example of a top-down schematic illustration of a liquid flow cell including electrodes.

FIG. 5 shows an example of a top-down schematic illustration of a liquid flow cell including electrodes. The liquid flow cell 500 shown in FIG. 5 may have a similar cross-section as the liquid flow cell 200 shown in FIG. 2I. The liquid flow cell 500 includes a first electrode 510 and a second electrode 520 disposed on a silicon nitride layer 505 of the liquid flow cell 500. Also shown are an inlet port 530, an outlet port 535, and a graphene sheet 552 covering a plurality of viewports (not shown). The first electrode 510 includes a first contact pad 512 proximate an edge of the second nitride layer 505, a first probe 514 at an edge of the inlet port 530, and a first lead 516 connecting the first contact 512 pad and the first probe 514. Similarly, the second electrode 520 includes a second contact pad 522 proximate the edge of the second nitride layer 505, a second probe 524 at an edge of the outlet port 535, and a second lead 526 connecting the second contact pad 522 and the second probe 524. In some embodiments, the first electrode 510 and the second electrode 520 comprise gold or platinum. In some embodiments, the first electrode 510 and the second electrode 520 are about 20 nm to 60 nm thick, or about 40 nm thick. In some embodiments, the first electrode 510 and the second electrode 520 are about 1 mm to 4 mm long, or about 2 mm to 3 mm long.

With the first electrode 510 and the second electrode 520, a bias or current can be applied across a liquid in a channel of the liquid flow cell 500 from the edge of the liquid flow cell. Other configurations of electrodes are possible, and the configuration may depend on the configuration of the TEM sample holder.

When fabricating a liquid flow cell according to the method 100 shown in FIG. 1, electrodes could be formed at many different points in the method 100. For example, in some embodiments, electrodes could be deposited and patterned after block 125 or after block 140.

A liquid flow cell can also be modified so that an electron beam impinges a first graphene sheet, a liquid, and a second graphene sheet, and the electron beam does not interact with a silicon nitride layer. Such a liquid flow cell may provide higher resolution imaging.

Figure 6:
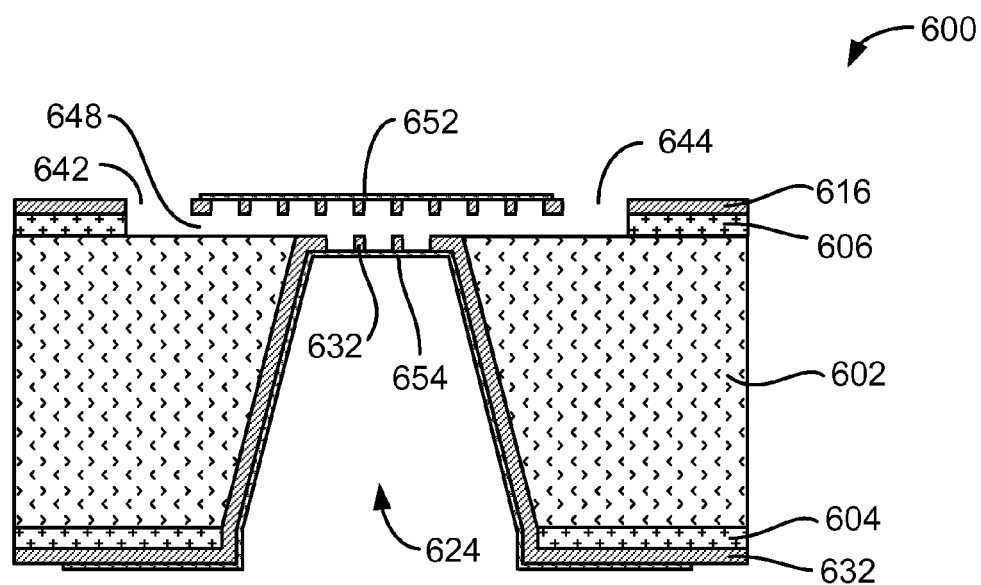
FIG. 6 shows an example of a cross-sectional schematic illustration of a liquid flow cell including two graphene sheets.

FIG. 6 shows an example of a cross-sectional schematic illustration of a liquid flow cell including two graphene sheets. The liquid flow cell 600 shown in FIG. 6 may be similar to the liquid flow cell 200 shown in FIG. 2I, with the third nitride layer defining a second plurality of viewports and a second graphene sheet covering the plurality of viewports. The liquid flow cell 600 includes a substrate 602, a first oxide layer 604, a second oxide layer 606, a third nitride layer 632, and a second nitride layer 616. The third nitride layer 632 is disposed on the walls of the substrate 602 that define a cavity 624. A first nitride layer is not shown in FIG. 6 because in the manufacturing process of a liquid flow cell 600, the first nitride layer disposed on the first oxide layer 604 may have the third nitride layer 632 disposed thereon, forming a single nitride layer, as explained with respect to block 125 of the method 100 shown in FIG. 1.

An inlet port 642, an outlet port 644, and a plurality of viewports (not indicated) are defined in the second nitride layer 616. A second plurality of viewports (not indicated) are defined in the third nitride layer 632. In some embodiments, the second plurality of viewports defined in the third nitride layer 632 have similar dimensions and spacing as the plurality of viewports defined in the second nitride layer 616. A channel 648 is defined in the second oxide layer 606 (e.g., a width of the channel defined by the second oxide layer 606 into and out of the plane of the page of FIG. 6). The channel 648 is also defined by a second graphene sheet 654, the third nitride layer 632, the second nitride layer 616, and a first graphene sheet 652. The first graphene sheet 652 is disposed on the second nitride layer 616 and covers the plurality of viewports. The second graphene sheet 654 is disposed on the third nitride layer 632 and covers the second plurality of viewports. In some embodiments, the first graphene sheet 652 comprises a monolayer of graphene. In some embodiments, the first graphene sheet 652 comprises a few layers of graphene. In some embodiments, the second graphene sheet 654 comprises a monolayer of graphene. In some embodiments, the second graphene sheet 654 comprises a few layers of graphene.

The liquid flow cell 600 may be fabricated with a method similar to the method 100 shown in FIG. 1 with some additional process operations. For example, in some embodiments, at block 130 of the method 100, a plurality of viewports is defined in the second nitride layer 616. A second plurality of viewports also may be defined in the third nitride layer 632. Then, in some embodiments, after block 135 of the method 100 (i.e., after the channel 648 is formed in the second oxide layer 606), the second graphene sheet 654 is positioned on the third nitride layer 632 to cover the second plurality of viewports defined in the third nitride layer 632.

The second graphene sheet 654 may be transferred to the liquid flow cell 600 with a wet transfer process or a dry transfer process. When the second graphene sheet 654 is put into position to seal the second plurality of viewports defined in the third nitride layer 632, the graphene sheet may be in contact with the third nitride layer 632 and be suspended over the cavity 624. To aid in ensuring the second graphene sheet 654 seals the viewports, a liquid (e.g., water) may be disposed between the second graphene sheet 654 and the third nitride layer 632. This may allow the second graphene sheet 654 suspended over the cavity 624 to move into the cavity 624. As the liquid evaporates, capillary action may pull in the second graphene sheet 654 onto the third nitride layer 632. For example, the partially fabricated liquid flow cell may be heated to about 50° C. to 150° C., or about 100° C., for about 5 minutes to 25 minutes, or about 15 minutes, to evaporate the liquid and aid in ensuring that the viewports defined in the third nitride layer 632 are sealed.

Further modifications of a flow cell are possible. For example, in some embodiments, a liquid flow cell includes multiple channels, two or more inlet ports, and/or two or more outlet ports. For example, a liquid flow cell may include two inlet ports and one outlet port. A channel from each inlet port may meet or join in the liquid flow cell and form one channel that connects to the outlet port. Observations of reactions that occur when two liquids mix could be made with such a liquid flow cell.

While embodiments of liquid flow cells described herein have been described as being used primarily in transmission electron microscopy, the liquid flow cells may also be used for other types of microscopy. For example, embodiments of the liquid flow cell may be used in conjunction with optical microscopy or near field optical microscopy, either in the transmission mode or reflection mode, due to the optical transparency of the materials of the liquid flow cell. This may provide the capability of performing correlative studies of biological samples with florescent tags using optical microscopy and electron microscopy and generate more detailed information regarding the structure, conformation, and dynamics of the biological samples.

A benefit of the fabrication methods described above is the use of silicon nitride membranes with small graphene viewports. A reduction in the bowing of graphene may contribute to a uniformly thin cross section of a channel for the flow of liquids and may be useful for subsequent analysis in both optical and electron microscopy.

Embodiments of the liquid flow cells described herein may be used for many different experiments. For example, a liquid flow cell may be used in experiments involving the chemical transformation of nanocrystals. Controlling such transformations has emerged as a versatile approach for the design of heterostructured nanocrystals with programmable structural, morphological, and compositional complexity. Study of the controlled dissolution of pre-made metal nanocrystals can generate valuable knowledge about the chemical reactivity and relative stability of different surface facets, which has implications not only for the chemical design of hybrid nanocrystals through controlled overgrowth, but also for the application of metal nanocrystals in catalysis and plasmonics. For example, a liquid flow cell may be used in experiments aimed at better understanding the dissolution of anisotropic gold nanocrystals with tailored surface facets under an electric bias.

As another example, a liquid flow cell may be used in experiments involving visualizing DNA permeation into cells under electric pulses. The science of relevance here is that electric pulses of sufficient strength cause an increase in the trans-membrane potential difference, which enables the permeation of DNA molecules. This phenomenon has been widely used in medical deliveries of complex DNA drugs into target cells and in selected gene expression, yet the delivery mechanism has not yet been visualized and interpreted. The detailed in situ record of DNA conformational change can give understanding of the mechanism involved, thereby enabling better engineering of this process for targeted drug delivery.

CONCLUSION

The liquid flow cells described herein allow for unprecedented resolution and contrast in TEM studies. Understanding electrochemical processes at the atomic scale has broad implications in catalysis, battery technology, and fuel cells. Further, the liquid flow cells may make possible new areas in biological research.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
   a first plate, the first plate comprising:
   a first substrate, the first substrate having a first surface and a second surface;
   a first oxide layer disposed on the first surface of the first substrate and a second oxide layer disposed on the second surface of the first substrate;
   a first nitride layer disposed on the first oxide layer and a second nitride layer disposed on the second oxide layer;
   a cavity defined in the first oxide layer, the first nitride layer, and the first substrate, the cavity including a third nitride layer disposed on walls of the first substrate and the second oxide layer that define the cavity;
   a channel defined in the second oxide layer;
   an inlet port and an outlet port defined in the second nitride layer in fluid communication with the channel;
   a plurality of viewports defined in the second nitride layer positioned between the inlet port and the outlet port, at least some of the plurality of viewports positioned opposite the cavity; and
   a first graphene sheet disposed on the second nitride layer covering the plurality of viewports.

2. The device of claim 1, further comprising:
   a second plate, the second plate comprising:
   a second substrate having a first surface and a second surface;
   a third oxide layer disposed on the first surface of the second substrate and a fourth oxide layer disposed on the second surface of the second substrate; and
   a third nitride layer disposed on the third oxide layer and a fourth nitride layer disposed on the fourth oxide layer, wherein the second plate defines a through hole through the third nitride layer, the third oxide layer, the second substrate, the fourth oxide layer, and the fourth nitride layer; and
   a polymer material joining the graphene sheet of the first plate and the fourth nitride layer of the second plate, wherein the first and the second plates are joined so that the cavity of the first plate is aligned with the though hole in the second plate.

3. The device of claim 2, wherein the first plate and the second plate define an inlet channel and an outlet channel, wherein the inlet channel is connected to the inlet port, and wherein the outlet channel is connected to the outlet port.

4. The device of claim 2, wherein the polymer material is about 2 microns to 8 microns thick.

5. The device of claim 2, wherein the polymer material is disposed proximate a perimeter of the cavity in the first substrate and a perimeter of the through hole in the second plate.

6. The device of claim 2, wherein the polymer material comprises an epoxy-based photoresist.

7. The device of claim 1, wherein first substrate comprises silicon, wherein the first and second oxide layers comprise silicon oxide, and wherein the first, second, and third nitride layers comprise silicon nitride.

8. The device of claim 1, wherein the graphene sheet comprises a few layers of graphene.

9. The device of claim 1, wherein the inlet port, the outlet port, and the plurality of view ports are about 60 nanometers to 500 nanometers in diameter.

10. The device of claim 1, wherein the first substrate is about 150 microns to 450 microns thick.

11. The device of claim 1, wherein the first surface and the second surface have dimensions of about 2 millimeters to 8 millimeters by about 2 millimeters to 8 millimeters.

12. The device of claim 1, further comprising:
a first electrode disposed on the second nitride layer, wherein the first electrode comprises:
  a first contact pad proximate an edge of the second nitride layer,
  a first probe at an edge of the inlet port, and
  a first lead connecting the first contact pad and the first probe; and
a second electrode disposed on the second nitride layer, wherein the second electrode comprises:
  a second contact pad proximate the edge of the second nitride layer,
  a second probe at an edge of the outlet port, and
  a second lead connecting the second contact pad and the second probe.

13. The device of claim 12, wherein the first electrode and the second electrode comprise gold or platinum.

14. The device of claim 1, wherein a second plurality of viewports is defined in the third nitride layer, further comprising:
a second graphene sheet disposed on the third nitride layer covering the second plurality of viewports.

15. A device comprising:
a first substrate, the first substrate having a first surface and a second surface;
a first nitride layer disposed on the first surface of the first substrate and a second nitride layer disposed on the second surface of the first substrate;
an oxide layer disposed on the second nitride layer;
a third nitride layer disposed on the oxide layer;
a cavity defined in the first nitride layer and the first substrate;
a channel defined in the oxide layer;
an inlet port and an outlet port defined in the third nitride layer in fluid communication with the channel;
a plurality of viewports defined in the third nitride layer positioned between the inlet port and the outlet port, at least some of the plurality of viewports positioned opposite the cavity; and
a first graphene sheet disposed on the third nitride layer covering the plurality of viewports.

16. A method comprising:
(a) forming a first oxide layer on a first surface of a first substrate and a second oxide layer on a second surface of the first substrate;
(b) depositing a first nitride layer on the first oxide layer and a second nitride layer on the second oxide layer;
(c) removing a portion of the first nitride layer and the first oxide layer;
(d) forming a cavity in the first substrate to expose the second oxide layer;
(e) depositing a third nitride layer on the first nitride layer, first substrate walls of the cavity, and the second oxide layer;
(f) forming an inlet port, an outlet port, and a plurality of viewports between the inlet port and the outlet port in the second nitride layer, at least some of the plurality of viewports positioned to be opposite the cavity;
(g) removing a portion of the second oxide layer to form a channel from the inlet port to the outlet port; and
(h) positioning a graphene sheet on the second nitride layer to cover the plurality of viewports.

17. The method of claim 16, further comprising:
forming a first oxide layer on a first surface of a second substrate and a second oxide layer on a second surface of the second substrate;
depositing a first nitride layer on the first oxide layer of the second substrate and a second nitride layer on the second oxide layer of the second substrate;
removing a portion of the first nitride layer and the first oxide layer of the second substrate;
forming a cavity in the second substrate to expose the second oxide layer of the second substrate;
depositing a polymer material on the second nitride layer of the second substrate;
removing a portion of the polymer material, the second nitride layer of the second substrate, and the second oxide layer of the second substrate to form a through hole; and
joining the graphene sheet of the first substrate to the second nitride layer of the second substrate with the polymer material, wherein the cavity of the first substrate is aligned with the though hole of the second substrate.

18. The method of claim 16, further comprising:
after operation (e), forming a first electrode on the second nitride layer, wherein the first electrode includes a first contact pad proximate an edge of the second nitride layer, a first probe at an edge of the inlet port, and a first lead connecting the first contact pad and the first probe; and
forming a second electrode on the second nitride layer, wherein the second electrode includes a second contact pad proximate the edge of the second nitride layer, a second probe at an edge of the outlet port, and a second lead connecting the second contact pad and the second probe.

19. The method of claim 16, wherein operation (f) includes forming a second plurality of viewports in the third nitride layer.

20. The method of claim 19, further comprising:
after operation (g), positioning a second graphene sheet on the third nitride layer to cover the plurality of viewports defined in the third nitride layer.

* * * * *